(12) United States Patent
Nicolas et al.

(10) Patent No.: US 9,139,424 B2
(45) Date of Patent: Sep. 22, 2015

(54) METHOD OF ENCAPSULATING A MICROELECTRONIC DEVICE

(71) Applicant: COMMISSARIAT A L'ENERGIE ATOMIQUE ET AUX ENE ALT, Paris (FR)

(72) Inventors: Stephane Nicolas, Meylan (FR); Xavier Baillin, Crolles (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 13/950,822

(22) Filed: Jul. 25, 2013

(65) Prior Publication Data

US 2014/0038364 A1 Feb. 6, 2014

(30) Foreign Application Priority Data

Jul. 31, 2012 (FR) ...................................... 12 57418

(51) Int. Cl.
*B81C 1/00* (2006.01)
*H01L 21/56* (2006.01)
*H01L 23/00* (2006.01)

(52) U.S. Cl.
CPC ......... *B81C 1/00285* (2013.01); *B81C 1/00293* (2013.01); *H01L 21/56* (2013.01); *H01L 24/96* (2013.01); *B81C 2203/0145* (2013.01); *H01L 2924/0002* (2013.01)

(58) Field of Classification Search
CPC ..... H01L 21/26; H01L 21/561; H01L 21/563; H01L 2224/80904; H01L 24/93; H01L 24/96; B81C 1/00285; B81C 1/00293; B81C 2203/0145

USPC .......................... 438/25, 26, 51, 55
See application file for complete search history.

(56) References Cited

U.S. PATENT DOCUMENTS

| 2007/0259470 | A1 | 11/2007 | Quenzer et al. |
| 2013/0024394 | A1 | 1/2013 | Yamahara |
| 2014/0342487 | A1* | 11/2014 | Nicolas ........................... 438/51 |

FOREIGN PATENT DOCUMENTS

| DE | 10 2007 008 380 A1 | 8/2008 |
| WO | WO 2005/078458 A1 | 8/2005 |

OTHER PUBLICATIONS

French Preliminary Search Report issued Apr. 19, 2013, in French Application No. 12 57418 filed Jul. 31, 2012 (with English Translation of Categories of Cited Documents).

(Continued)

*Primary Examiner* — Thanhha Pham
(74) *Attorney, Agent, or Firm* — Oblon, McClelland, Maier & Neustadt, L.L.P.

(57) ABSTRACT

A method of encapsulating at least one microelectronic device is provided, including encapsulating the device in a cavity hermetically sealed against air, a cap of the cavity including at least one wall permeable to at least one noble gas; injecting the noble gas into the cavity through the wall permeable to the noble gas; hermetically sealing the cavity against air and the injected noble gas; forming the device on at least one first substrate; bonding at least one second substrate to the first substrate, thereby forming the cavity hermetically sealed against air, the wall permeable to the noble gas being formed by part of the second substrate; and forming, between the encapsulating and the injecting, at least one portion of material impermeable to the noble gas such that said portion partially covers the part of the second substrate that forms the wall permeable to the noble gas.

14 Claims, 5 Drawing Sheets

(56) References Cited

OTHER PUBLICATIONS

Rihui He, et al., "On-Wafer Monolithic Encapsulation by Surface Micromachining With Porous Polysilicon Shell", Journal of Microelectromechanical Systems, vol. 16, No. 2, Apr. 2007, 11 pages.

U.S. Appl. No. 14/198,947, filed Mar. 6, 2014, Nicolas.
U.S. Appl. No. 14/264,624, filed Apr. 29, 2014, Nicolas.
U.S. Appl. No. 14/555,913, filed Nov. 28, 2014, Baillin.

* cited by examiner

METHOD OF ENCAPSULATING A MICROELECTRONIC DEVICE

TECHNICAL FIELD

This document relates to a method of encapsulating at least one microelectronic device such as a MEMS (Micro-Electro-Mechanical Systems), NEMS (Nano-Electro-Mechanical Systems), MOEMS (Micro-Opto-Electro-Mechanical Systems), or NOEMS (Nano-Opto-Electro-Mechanical Systems) type micro-system in a hermetic cavity in which at least one noble gas is enclosed at a controlled pressure.

STATE OF PRIOR ART

Encapsulation of a microelectronic device such as a MEMS type device can firstly provide protection from external elements (humidity, particulate pollution, reactive elements such as oxygen or other non neutral gases) and secondly control the atmosphere (pressure, nature of surrounding gas, etc.) applied in the cavity inside which the microelectronic device is encapsulated.

For example, a gyroscope type device usually has to be encapsulated in an environment under a vacuum (for example at a pressure of between about $10^{-1}$ and $10^{-3}$ mbars) if it is to function correctly. For an RF (Radio Frequency) switching type device, encapsulation at a pressure approximately equal to atmospheric pressure in a "neutral" gas environment is sought, for example to avoid oxidation of switch contact zones. In this case, an $N_2$, Ar or He type gas has to be used to encapsulate this type of device.

In the case of encapsulation of a MEMS device with transfer of the cap by hermetic sealing (cavity formed between two substrates bonded to each other), control of the pressure and the nature of the gas in the cavity inside which the device is encapsulated depends on the use of a wafer bonder with the capability of:

controlling the pressure inside the wafer bonder chamber before making contact and sealing the two substrates;
injecting a neutral gas, for example nitrogen or argon, into the wafer bonder chamber at a controlled pressure.

During such encapsulation, the first substrate on which the device is made and the second substrate that will form the cap of the cavity are firstly aligned with each other inside or outside the wafer bonder chamber. A support mechanically holds the two substrates in line with each other while they are loaded into the wafer bonder chamber. The two substrates are separated from each other by shims and are not in contact with each other. A vacuum is then created in the wafer bonder chamber to flush out all air present between the two substrates. A set pressure equal to the required encapsulation pressure is imposed in the chamber. At the same time, neutral gas is injected into the wafer bonder chamber at a controlled pressure and the two substrates are brought into contact with each other and hermetically sealed, thus forming the cavity inside which the device is encapsulated.

When such an encapsulation is applied collectively forming several cavities within which several devices are encapsulated, it is impossible to have different atmospheres (pressures, etc.) in the different cavities.

It is much more difficult to control the atmosphere in the cavity in the case in which thin layer packaging (cavity formed between a substrate and a thin layer forming the cap) is used to encapsulate the device. Such encapsulation thus consists of applying the following steps:

deposit and shape a sacrificial layer on the substrate, covering the device,
deposit a thin layer called the cap layer, for example composed of a semiconductor such as silicon, an oxide or a nitride, that will form the cap and will cover the sacrificial layer;
etch the cap layer to form release holes passing through the cap layer,
etch the sacrificial layer through the release holes,
hermetically seal the release holes by depositing a thin layer, for example composed of a semiconductor such as silicon, an oxide, a nitride or a metal such as Ti or Al.

The step for hermetically sealing the release holes is done using PECVD (plasma enhanced chemical vapour deposition) or PVD (physical vapour deposition) type deposition equipment that can only operate within a restricted pressure range, usually less than 5 mbars. Therefore it is impossible to make such an encapsulation for microelectronic devices which require pressures of more than 5 mbars, for example between 1 bar and 5 mbars to function correctly.

One solution for solving this problem consists of introducing materials into the cavity capable of degassing after the cavity has been hermetically sealed, thus increasing the pressure applied in the cavity. However, the value of the residual pressure obtained in the cavity, in other words the final pressure achieved after such degassing, is very difficult to control in this case.

PRESENTATION OF THE INVENTION

Thus there is a need to propose a method for encapsulating at least one microelectronic device, making it possible to create an atmosphere comprising at least one gas that is non reactive to the device within a cavity inside which the device is encapsulated, with very good control of this gas pressure in the cavity, this pressure possibly being greater than or less than about 5 mbars depending on the envisaged application.

To achieve this, one embodiment discloses a method of encapsulating at least one microelectronic device, comprising at least the following steps:

encapsulate the microelectronic device in a cavity hermetically sealed against air, or airtight, and comprising at least one wall permeable to at least one noble gas;
inject the noble gas into the cavity through the wall permeable to the noble gas;
hermetically seal the cavity against air and the noble gas injected into the cavity.

The term "noble gas" in this description denotes a gas or a mix of several gases corresponding to the chemical elements in group 18 in the periodic table of elements, in other words helium and/or neon, and/or argon and/or krypton and/or xenon and/or radon, also called rare gases or chemically inert gases. The method is advantageously used for a noble gas comprising neon and/or helium and/or argon, particularly due to the small sizes of molecules of these gases, facilitating their passage through the permeable wall.

Thus, starting from a cavity hermetically sealed against air and for which at least one of the walls is fully or partly permeable to at least one gas that is non-reactive to the microelectronic device, this non-reactive gas is introduced into the cavity through the permeable wall so as to precisely obtain the required residual pressure in the cavity. The cavity is then hermetically sealed against air and this gas, for example by depositing a barrier layer impermeable to this gas to maintain and stabilise the final pressure obtained in said cavity.

Therefore this method depends on the fact that some materials, including the material used to make the permeable wall of the cavity, are permeable only to one or several noble gases and particularly helium and/or neon and/or argon and are impermeable to air, or airtight.

Such an encapsulation method can be used to make an individual encapsulation of one or several microelectronic devices, in other words encapsulation at component level (for example after cutting the substrate on which the device(s) is (are) made as individual chips), or simultaneous collective encapsulation of several microelectronic devices made on a single substrate. In the case of collective encapsulation, this method makes it possible to create different atmospheres in different cavities.

The encapsulation method can result in a pressure inside the cavity varying from atmospheric pressure or even several bars, to a high vacuum (for example to about $10^{-4}$ mbars), once the cavity has been hermetically sealed against air and the injected noble gas.

The cap of the cavity may comprise the wall permeable to at least one noble gas. Such configuration facilitates the injection of the noble gas in the cavity, for example if this injection is carried out through the upper wall of the cavity.

The step to encapsulate the microelectronic device in the cavity hermetically sealed against air may advantageously be done under a vacuum, for example at a pressure of between about $10^{-4}$ mbars and $10^{-5}$ mbars, or less than $10^{-5}$ mbars, to reduce the quantity of reactive residual gases in the cavity.

The microelectronic device may be of the MEMS and/or NEMS and/or MOEMS and/or NOEMS type. The encapsulation method may advantageously be used to encapsulate an inertial type MEMS and/or NEMS device, for example an accelerometer or a gyroscope, or an RF type device, for example a BAW (bulk acoustic wave) filter.

The noble gas may be helium and/or neon, and/or argon, and/or the wall permeable to the noble gas may comprise a semiconducting oxide (for example $SiO_2$) and/or semiconducting nitride (for example SiN or $Si_3N_4$) and/or glass. The wall permeable to the noble gas may in particular comprise a borosilicate type glass, for example "Pyrex", or silica glass or "borofloat" glass.

The microelectronic device may be encapsulated in the cavity with the following steps:
  make the microelectronic device on at least one first substrate;
  bond at least one second substrate to the first substrate, forming the cavity hermetically sealed against air, the wall permeable to the noble gas being formed by part of the second substrate.

The cap of the cavity corresponds in this case to at least said part of the second substrate.

The cavity may be hermetically sealed against air and the noble gas by at least one deposition of at least one layer of material impermeable to air and the noble gas, covering at least the part of the second substrate forming the wall permeable to the noble gas.

Encapsulation of the microelectronic device in the cavity may include the following steps:
  make the microelectronic device on at least one first substrate,
  make at least one portion of sacrificial material covering the microelectronic device,
  deposit at least one cap layer on the first substrate, covering the portion of sacrificial material and comprising at least one material impermeable to air,
  make at least one opening through the cap layer, forming at least one access to the portion of sacrificial material,
  etch the portion of sacrificial material through the opening formed through the cap layer,
  close the opening with at least one material impermeable to air,
  at least part of the cap layer and/or the sealing material of the opening can be permeable to the noble gas and form the wall permeable to the noble gas,
  and the noble gas may be injected into the cavity through at least the wall permeable to the noble gas.

The cap of the cavity corresponds in this case to at least said part of the cap layer and/or said sealing material.

Hermetic sealing of the cavity against air and the noble gas may comprise at least one deposition of at least one layer of a material impermeable to air and the noble gas such that it covers at least the material impermeable to air and permeable to the noble gas.

The encapsulation method may also include making at least one portion of material impermeable to the noble gas partially covering the part of the second substrate forming the wall permeable to the noble gas or partially covering the material impermeable to air and permeable to the noble gas, forming the wall permeable to the noble gas, between encapsulation of the microelectronic device in the cavity and injection of the noble gas into the cavity. Thus, the portion of material impermeable to the noble gas forms a selective mask enabling a variable quantity of the noble gas to pass into the cavity.

The layer of material impermeable to air and to the noble gas may comprise a semiconductor and/or metal.

When the microelectronic device is encapsulated in the cavity, at least one portion of getter material may be placed in the cavity, the method also possibly comprising a thermal activation of the portion of getter material, during and/or after hermetic sealing of the cavity against air and the noble gas.

Such a portion of getter material can maintain the quality of the atmosphere by for example trapping residual gases such as oxygen, nitrogen, hydrogen, water, carbon monoxide or dioxide that may be present in the cavity, to maintain solely the pressure of the injected noble gas inside the cavity.

The encapsulation step may include a collective encapsulation of a plurality of microelectronic devices in several cavities hermetically sealed against air, each of which comprises at least one wall permeable to at least one noble gas, the step to inject the noble gas may be done for at least some of the cavities, and the hermetic sealing step may be applied collectively for all the cavities. This thus reduces the cost related to encapsulation of microelectronic devices. Furthermore, when this method carried out collectively for several microelectronic devices and the method includes the production of at least one portion of material impermeable to the noble gas partially and/or completely covering some of the cavities, cavities with different residual pressures can be made simultaneously because said portion of material impermeable to the noble gas may then form a selective mask allowing a passage of the variable quantities of noble gas into each of the cavities.

BRIEF DESCRIPTION OF THE DRAWINGS

This invention will be better understood after reading the description of example embodiments given purely for guidance and in no way limitative with reference to the appended drawings in which.

Identical, similar or equivalent parts of the different figures described below have the same numeric references to facilitate comparison between different figures.

The different parts shown in the figures are not necessarily all at the same scale, to make the figures more easily readable.

The different possibilities (variants and embodiments) must be understood as not being exclusive to each other and they may be combined with each other.

DETAILED PRESENTATION OF PARTICULAR EMBODIMENTS

Refer firstly to FIGS. 1A to 1E that show the steps of a method of encapsulating a microelectronic device 100 according to a first embodiment.

Figure 1A:
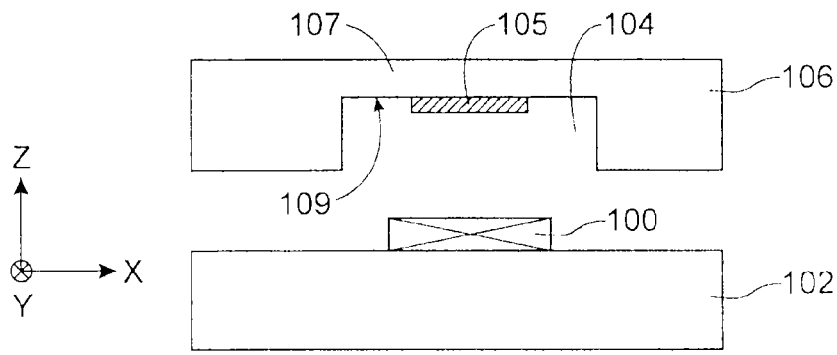
FIGS. 1A to 1D show steps of a method of encapsulating a microelectronic device according to a first embodiment.

As shown in FIG. 1A, the microelectronic device 100, in this case of the MEMS type, is made firstly on a first substrate 102, for example comprising a semiconductor such as silicon.

The device 100 is intended to be encapsulated in a cavity 104 formed between the first substrate 102 and a second substrate 106. In this first embodiment, the cavity 104 is formed firstly by etching at a face of the second substrate 106 which is intended to be placed facing the device 100. The first substrate 102 and the second substrate 106 are material layers corresponding to wafers for example with thicknesses (dimension along the z axis shown in FIG. 1A) of more than about 1 µm.

The second substrate 106 comprises a part 107 that is permeable to at least one noble gas (helium in this first embodiment) intended to be injected into the cavity 104 and that forms a wall 109 of the cavity 104 permeable to this noble gas. This permeability of the part 107 of the second substrate 106 to helium is obtained as a result of the nature of the material of the second substrate 106 that in this case comprises glass, for example borosilicate type glass such as "Pyrex", silica glass or "borofloat" type glass, permeable to helium and also as a result of the thickness of this part 107 forming the upper wall 109 of the cavity. In one variant embodiment, the second substrate 106 could comprise any material permeable to the gas(es) that will be injected into the cavity 104, for example a polymer such as epoxy. In general, the thickness of the part 107 of the second substrate 106 forming the permeable wall 109 of the cavity 104 may be between about 50 µm and 1 mm.

In this first embodiment, a portion of getter material 105, for example comprising a metal such as titanium, is arranged in contact with a part of this wall 109 such that this getter material will be encapsulated in the cavity 104 after the cavity has been hermetically sealed. In one variant, the portion of getter material 105 could be made on another wall of the cavity 104, for example on at least one of the sidewalls of the cavity 104 or on the first substrate 102, adjacent to the microelectronic device 100. It is also possible that there is no getter material present in the cavity 104.

Figure 1B:
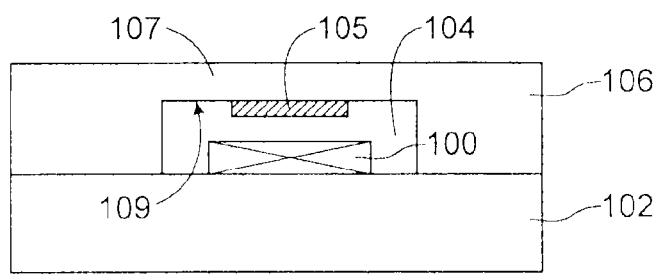

As shown in FIG. 1B, the two substrates 102 and 106 are bonded to each other such that the device 100 is encapsulated in the cavity 104 formed between the second substrate 106 and the first substrate 102. Bonding the two substrates 102 and 106 to each other corresponds to a standard hermetic seal, without any gas injection into the wafer bonder chamber. Sealing may advantageously be done under a vacuum, for example at a pressure of between about $10^{-4}$ to $10^{-5}$ mbars (pressure corresponding to the pressure in the wafer bonder chamber), this pressure therefore being the pressure in the cavity 104 after sealing, thus reducing the quantity of "reactive" residual gases such as oxygen, nitrogen, hydrogen, water, carbon monoxide or dioxide that may be present in the cavity 104.

In one variant, bonding between the first substrate 102 and the second substrate 106 may be done by means of a sealing strip present between the two substrates 102, 106. In this case, the sidewalls of the cavity 104 may be fully or partly formed by the sealing strip, and the height of the cavity is equal to at least the thickness of the sealing strip.

Figure 1C:
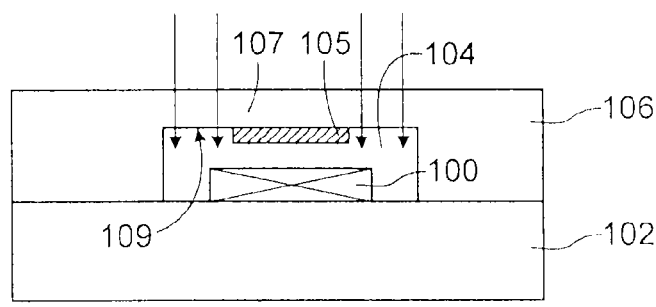

The two substrates 102 and 106 bonded to each other are then placed in a wafer bonder chamber in which the noble gas, in this case helium, can be injected through the wall 109 of the cavity 104 at a known pressure for a given time (see FIG. 1C, in which the injection of helium into the cavity 104 through the wall 109 is symbolically shown by arrows 110). Considering the presence of the getter material 105, helium is injected into the cavity 104 through only part of the wall 109 corresponding to the part of the surface of the wall 109 not covered by the portion of getter material 105. The injection of the noble gas in the cavity 104 is facilitated as this injection is made trough the cap of the cavity 104, here through the upper wall 109 of the cavity 104.

The pressure ΔP obtained in the cavity 104 depends on the helium pressure (P), the temperature (T) in the chamber, the surface area (S) of the wall 109 through which the noble gas can be injected (which in this case is the part of the area of the wall 109 not covered by the portion of getter material 105), the thickness (e) of the material forming the permeable wall 109 (in other words the thickness of the part 107 of the second substrate 106), the duration (t) of the injection step and the volume (V) of the cavity 104, and is equal to $$\Delta P = K \cdot S \cdot t \cdot P / (e \cdot V) \tag{1}$$

where K is a coefficient that depends on the temperature T and the nature of the material forming the wall 109. For example, for a second substrate 106 comprising glass used for anodic sealing (glass with the "Pyrex" or "Borofloat" trade name) and for parameters P=1 bar, T=20° C., t=1200 s, S=10 mm², e=0.5 mm, and V=0.3 mm³, the result is $\Delta P = 10^{-1}$ mbars. With T=100° C. (the values of the other parameters being unchanged), a pressure ΔP equal to $10^{-1}$ mbars can be achieved with a duration t of only 5 seconds.

Figure 1D:
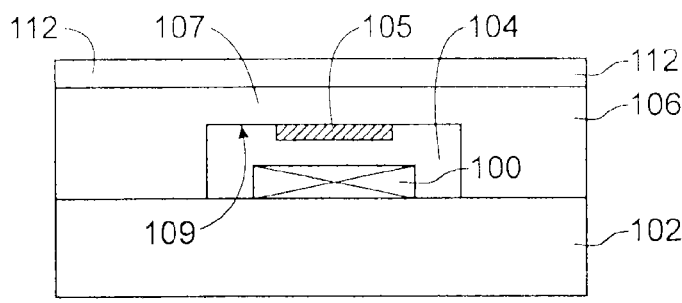

A layer 112 impermeable to the neutral gas is injected into the cavity 104, in this case a thin metallic layer comprising for example aluminium and/or titanium, or comprising a semiconductor such as silicon, and with a thickness of between about 1 µm and 10 µm, is then deposited on the second substrate 106 so as to cover the part 107 permeable to the injected gas and prevent helium trapped in the cavity 104 from escaping from it (see FIG. 1D).

The encapsulation method may be completed by thermal activation of the portion of getter material 105, this thermal activation also being possible during assembly of the two substrates 102 and 106. The getter material 105 then pumps non-neutral residual gases present in the cavity 104, if any. On the other hand, neutral gases such as helium are not pumped by the getter material, because noble gases do not react with the getter due to the fact that they are not reactive.

We will now describe the steps of a collective method for encapsulating several microelectronic devices 100.1-100.3 according to a second embodiment, with reference to FIGS. 2A to 2E.

The microelectronic devices 100.1-100.3 (there are three in the example described with reference to FIGS. 2A to 2E)

are made on the first substrate 102. Several cavities 104.1-104.3 are also formed in the second substrate 106, and each device 100.1-100.3 will be encapsulated in one of the cavities 104.1-104.3.

Figure 2A:
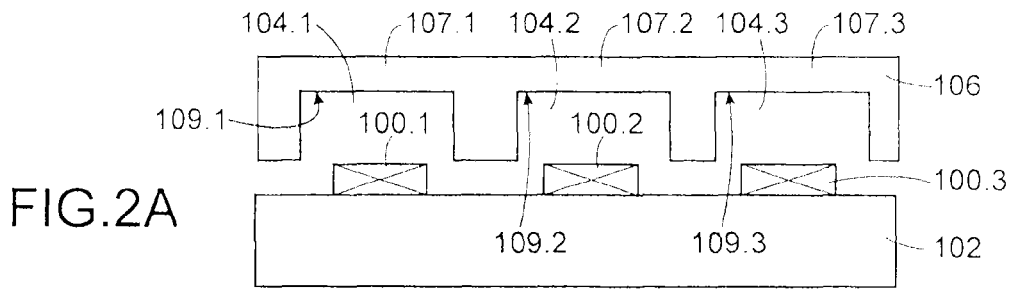
FIGS. 2A to 2E show steps of a method of encapsulating several microelectronic devices according to a second embodiment.
Figure 2B:
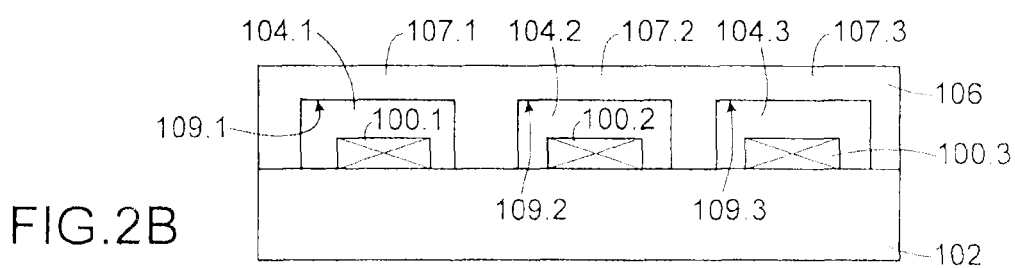
Figure 2C:
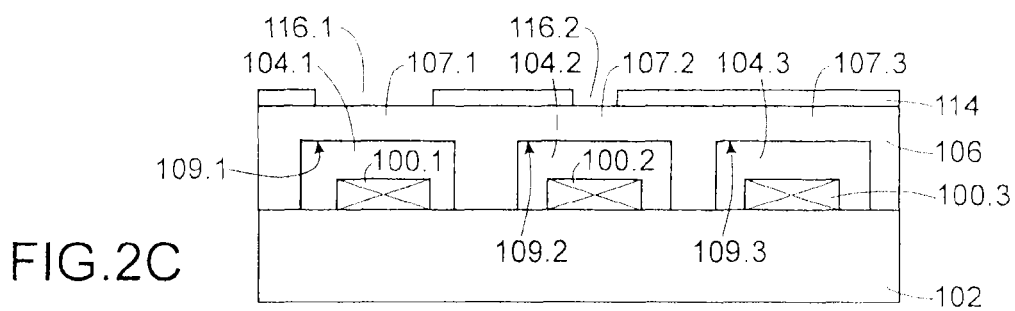
Figure 2D:
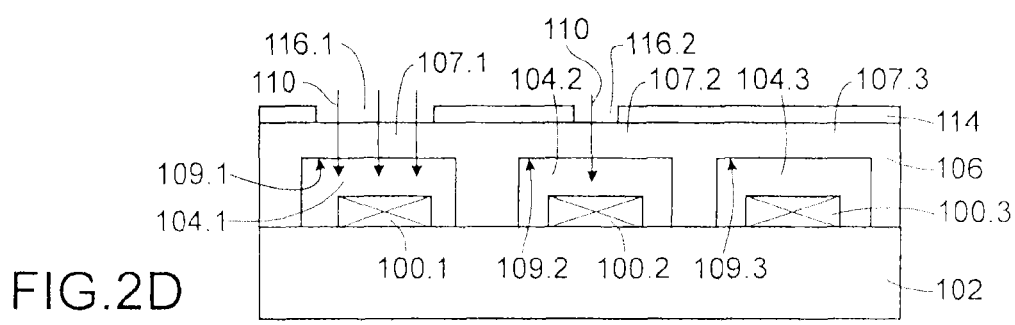

As in the first embodiment, the two substrates 102 and 106 are aligned with each other and are then hermetically bonded to each other so that the devices 100.1-100.3 are individually encapsulated in each of the cavities 104.1-104.3 formed between the second substrate 106 and the first substrate 102 (FIG. 2B). Each cavity 104.1-104.3 comprises at least one wall 109.1-109.3 permeable to at least one noble gas.

A layer 114 impermeable to the gas (in this case helium) intended to be injected into the cavities is formed on the second substrate 106. This layer 114, for example comprising at least one metal such as Ti or Al and/or a semiconductor such as silicon, is then etched so as to form openings aligned with the wall(s) 109 through which the gas will be injected. Thus, for each cavity, the opening formed through the layer 114 can be sized as a function of the quantity of gas to be injected into the cavity. In the example shown in FIG. 2C, a first opening 116.1 is made at the first cavity 104.1 and reveals the entire surface or almost the entire surface of the wall 109.1 of the cavity 104.1 permeable to the gas to be injected. A second opening 116.2 is made in the layer 114 facing the second cavity 104.2. On the other hand, unlike the first opening 116.1, this second opening 116.2 only exposes part of the surface of the wall 109.2 of the cavity 104.2 permeable to the gas to be injected. Therefore, the opening 116.2 is sized as a function of the quantity of gas that will be injected into the cavity 104.2. Finally, no opening is made through the layer 114 at cavity 104.3 so that when gas is injected into the cavities 104.1 and 104.2, no gas is injected into the third cavity 104.3 through the wall 109.3.

The next step is a controlled injection of helium into the cavities 104.1 and 104.2 through the upper walls 109.1 and 109.2 of these cavities, in other words through the parts 107.1 and 107.2 of the second substrate 106 (injection of gas shown symbolically by arrows 110). The quantity of helium penetrating into the cavities 104.1 and 104.2 depends particularly on the opening ratio of the layer 114 above each cavity.

Using formula (1) defined above with reference to the first embodiment, the opening ratio of the layer 114 corresponds to a coefficient of between 0 and 1 applied to the parameter (S), in other words the surface area of the wall 109 through which the noble gas can be injected. In the example in FIG. 2D, the quantity of injected helium is greater in the first cavity 104.1 than in the second cavity 104.2. There is no injection of helium into the third cavity 104.3.

Therefore, this second embodiment can give different residual pressures in the different cavities made collectively and simultaneously from a single substrate forming the cavity caps, this being further facilitated because the injection of the noble gas is made trough the caps of the cavities 104.1 and 104.2, here through the upper walls 109.1 and 109.2 of the cavities 104.1 and 104.2.

Figure 2E:
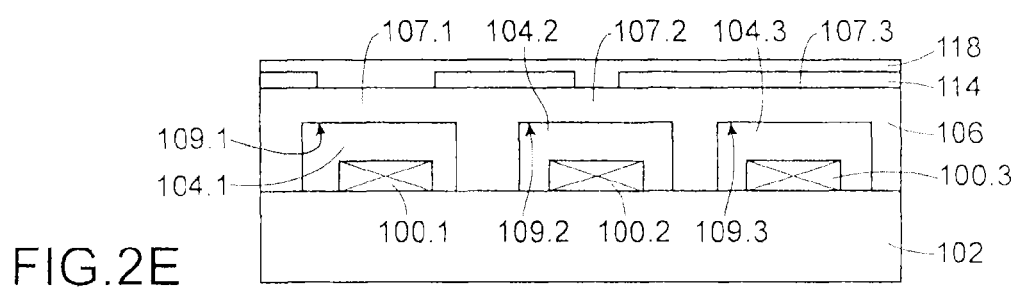

As shown in FIG. 2E, another layer 118 hermetic against the injected gas (helium), for example comprising at least one metal and/or at least one semiconductor, is deposited at least in the openings 116 made through the layer 114 to hermetically seal the cavities 104.1-104.3 against air and the injected gas. In the example in FIG. 2E, the second hermetic layer 118 is deposited over the entire surface of the hermetic layer 114 and in the openings 116.1 and 116.2.

We will now describe the steps of a method of encapsulating a microelectronic device, according to a third embodiment, with reference to FIGS. 3A to 3F.

Figure 3A:
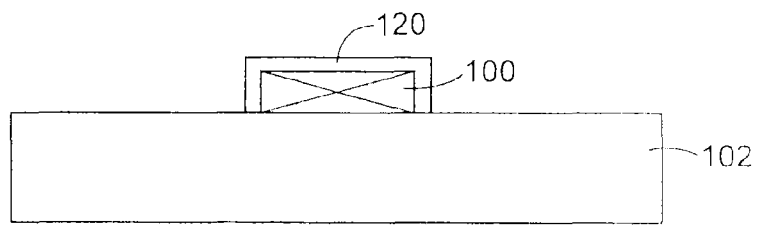
FIGS. 3A to 3F show steps of a method of encapsulating a microelectronic device according to a third embodiment.

As in the first embodiment, the microelectronic device 100 is made on the substrate 102. However, unlike the previous two embodiments, the device 100 will not be encapsulated by transferring a second substrate onto the substrate 102, but rather by making a cap comprising one or several thin layers. As shown in FIG. 3A, a sacrificial layer is deposited on the first substrate 102, and covers the device 100. This sacrificial layer is shaped such that a remaining portion 120 of the sacrificial material covers the device 100, occupying a volume corresponding to the required volume of the cavity in which the device 100 will be encapsulated.

Figure 3B:
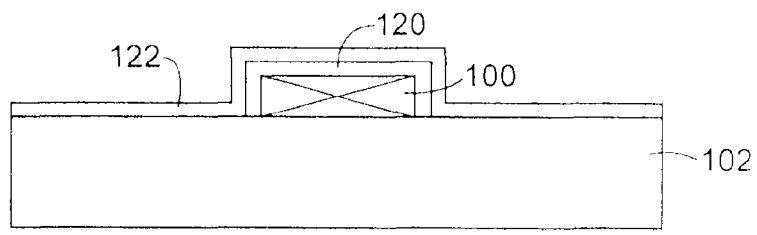

As shown in FIG. 3B, a layer of material 122 that will form the cap of the cavity in which the device 100 will be encapsulated is then deposited on the substrate 102 covering the portion of the sacrificial material 120.

The layer 122 is called the cap layer and is a thin layer, for example less than about 10 μm thick, and comprises a semiconductor such as silicon, a semiconductor oxide or a semiconductor nitride. The material used for this cap layer 122 and the material of the portion of sacrificial material 120 are chosen such that the sacrificial material of the portion 120 can be etched selectively relative to the material of the cap layer 122 (and without damaging the device 100). The cap layer 122 may also be composed of a stack of several layers.

Figure 3C:
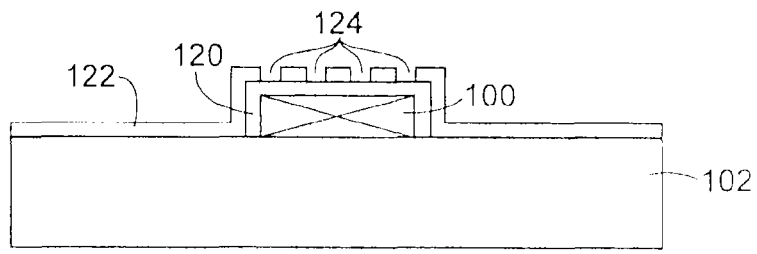
Figure 3D:
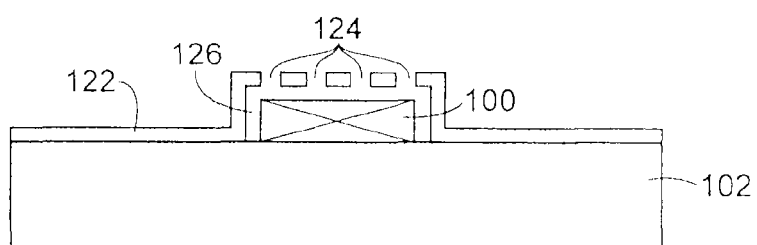

Openings 124 are then formed through the cap layer 122, for example by etching (through the part of the cap layer 122 that will form the upper wall of the cavity in the example described herein), thus forming accesses to the portion of the sacrificial material 120 through the cap layer 122 (FIG. 3C). The portion of sacrificial material 120 is then etched through the openings 124, for example by isotropic dry etching (FIG. 3D). The device 100 is then encapsulated in a cavity 126 formed between the substrate 102 and the cap layer 122.

Figure 3E:
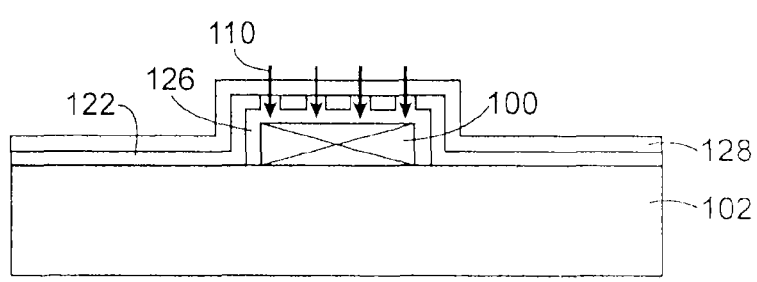

Openings 124 formed through the cap layer 122 are then hermetically sealed to prevent air from passing, thus closing the cavity 126. In the example described herein, this hermetic sealing is done by deposition of a thin sealing layer 128, for example comprising a semiconductor oxide, a semiconductor nitride or any other material that is impermeable to air but permeable to the gas that will be injected into the cavity 126 (FIG. 3E). This sealing layer 128, with the openings 124, forms a barrier permeable to the gas that will be injected into the cavity 126. A noble gas (symbolised by arrows 110) is then injected into the cavity 126 through the layer 128 and through the openings 124 at a controlled pressure and in a given time, as described in previously described embodiments. The injection of the noble gas in the cavity 126 is facilitated as this injection is made trough the cap of the cavity 126, and especially through the upper wall of the cavity 126.

In reusing the formula (1) described above and with parameters P=1 bar, T=20° C., S=10 mm², e=5 μm, and V=0.3 mm³, the resulting pressure obtained by injecting helium for a duration equal to about 12 seconds is $\Delta P=10^{-1}$ mbars. However, the volume V of the cavity 126 and the diffusion area S can be reduced by a factor of 10 for such encapsulation, giving approximately the same ΔP value because ΔP is proportional to S/V, and reducing these two parameters by the same factor will not cause any change to ΔP.

Figure 3F:
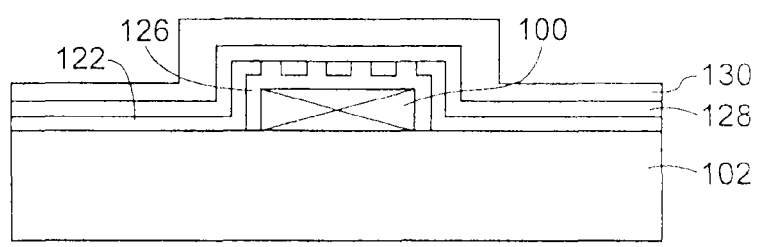

The encapsulation method is then completed by covering the sealing layer 128 with a layer 130, for example comprising a metal or a semiconductor, hermetic to the gas injected into the cavity 126 so as to maintain the pressure obtained in the cavity 126 as a result of the previous gas injection (FIG. 3F).

Such an encapsulation by thin layer may be used to make a collective encapsulation of several microelectronic devices made on a single substrate. The steps of a collective encapsulation method of several microelectronic devices 100.1-100.3 according to a fourth embodiment are described with reference to FIGS. 4A to 4H.

As in the second embodiment, several microelectronic devices 100.1-100.3 (three in the example described with reference to FIGS. 4A to 4H) are made on the first substrate 102, each of which will be encapsulated in a distinct cavity.

Each device 100.1-100.3 is covered with a portion of sacrificial material 120.1-120.3 similar to the portion of sacrificial material 120 described above (FIG. 4A).

Figure 4A:
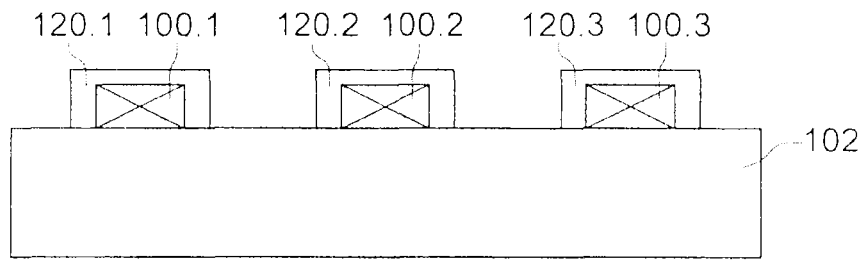
FIGS. 4A to 4H show steps of a method of encapsulating several microelectronic devices according to a fourth embodiment.
Figure 4B:
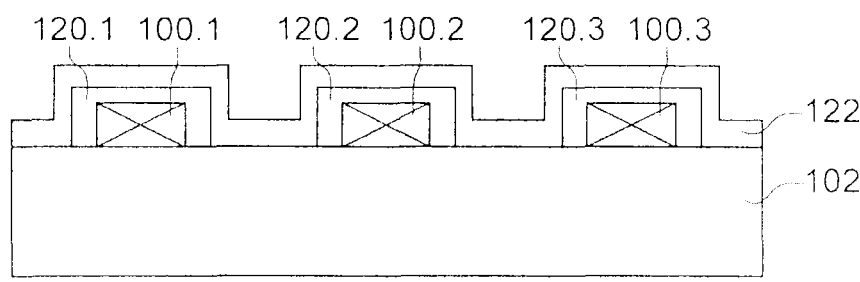

The substrate 102 and the portions of the sacrificial material 120.1-120.3 are then covered with at least one cap layer 122 similar to that described previously with reference to the third embodiment (FIG. 4B).

Figure 4C:
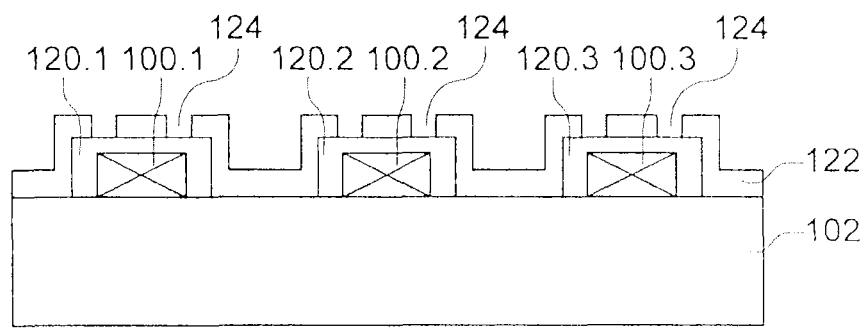
Figure 4D:
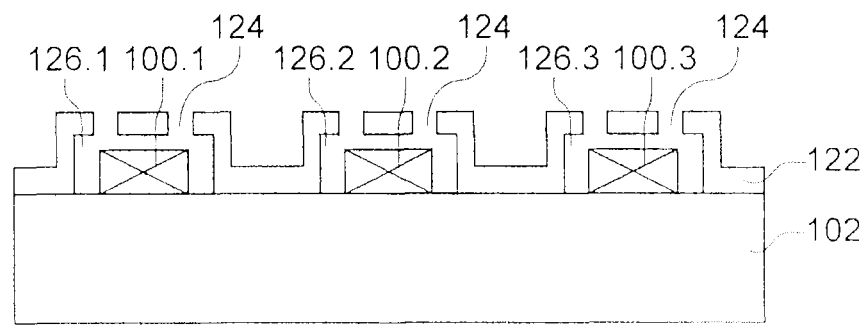

As before, the openings 124 are then made, for example by etching, through the cap layer 122, thus forming accesses to portions of the sacrificial material 120.1-120.3 through the cap layer 122 (FIG. 4C). Portions of sacrificial material 120.1-120.3 are then etched through the openings 124, for example by dry isotropic etching (FIG. 4D). Each of the devices 100.1-100.3 is then individually encapsulated in one of the cavities 126.1-126.3 formed between the substrate 102 and the cap layer 122.

Figure 4E:
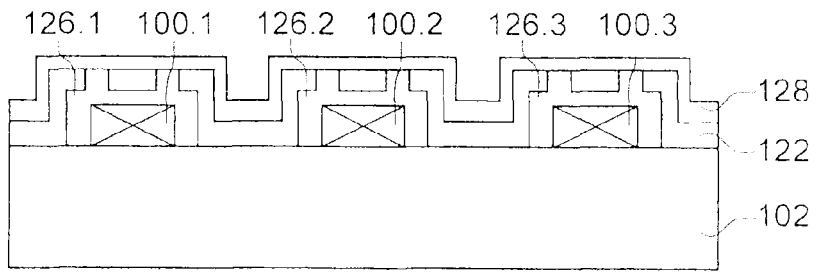

The openings 124 formed through the cap layer 122 are then hermetically sealed against air, for example by deposition of a thin sealing layer 128 similar to that described previously with reference to the third embodiment (FIG. 4E).

Figure 4F:
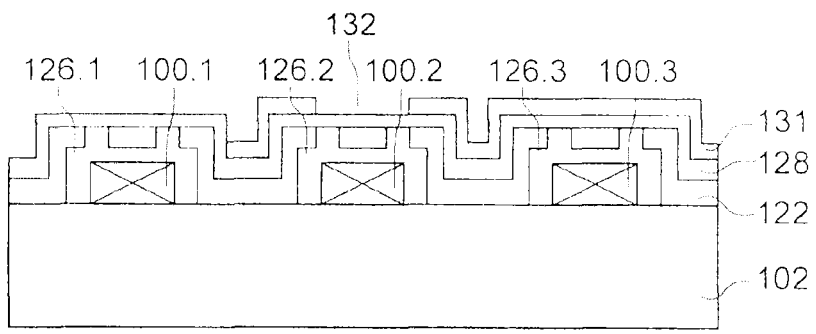

A layer 131 impermeable to the gas that will be injected into the cavities (in this case helium) is formed on the sealing layer 128 (FIG. 4F). The nature of this hermetic layer 131 may for example be similar to the nature of layer 114 previously described with reference to the second embodiment. This hermetic layer 131 is then etched to form openings at the wall(s) (formed by the layer 128) through which gas will be injected. Thus, for each cavity, the opening formed through the layer 131 can be dimensioned as a function of the quantity of gas to be injected. In the example shown in FIG. 4F, the part of the hermetic layer 131 above the first cavity 126.1 is fully etched in order to expose all the surface of the wall of the cavity 126.1 permeable to the gas to be injected. An opening 132 is formed in the layer 131 facing the second cavity 126.2. This opening 132 only exposes part of the surface of the wall of the cavity 126.2 permeable to the gas to be injected. The opening 132 is dimensioned as a function of the quantity of gas that will be injected into the cavity 126.2. Finally, no opening is made through the layer 131 at the third cavity 126.3 so that when gas is injected into the cavities 126.1 and 126.2, no gas is injected into the third cavity 126.3.

Figure 4G:
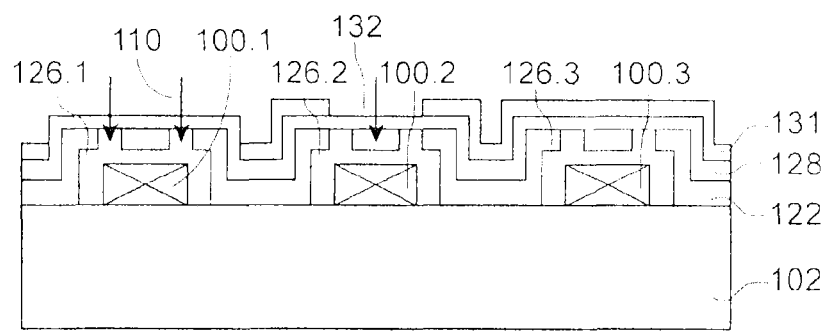

As shown in FIG. 4G, noble gas is then injected into cavities 126.1 and 126.2 through the layer 128 and through the openings 124 at a controlled pressure and in a given time, as described in the previously described embodiments. Presence of the hermetic seal layer 131 prevents diffusion of gas in the third cavity 126.3 and limits this diffusion of gas in the second cavity 126.2. Here again, the injection of the noble gas in the cavities 126.1 and 126.2 is facilitated as this injection is made trough the caps of these cavities.

Figure 4H:
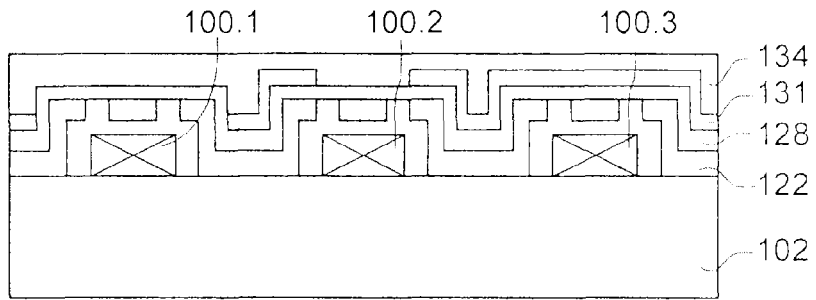

The method of encapsulating microelectronic devices 100.1-100.3 is completed by depositing a layer 134 hermetic to the gas injected into the cavities 126.1 and 126.2, for example similar to the layer 130 previously described with reference to the third embodiment and comprising at least one metal or semiconductor such as silicon (FIG. 4H).

In the second, third and fourth embodiments, there is no getter material present in the cavities formed. However, in one variant of these embodiments, a portion of getter material may be made in one or several formed cavities.

In one variant of the different embodiments described above, it is possible that the wall permeable to gas may be formed in the first substrate 102 and/or in a sealing strip bonding the two substrates 102 and 106 to each other.

The invention claimed is:

1. A method of encapsulating at least one microelectronic device, comprising:
    encapsulating the at least one microelectronic device in a cavity hermetically sealed against air, a cap of the cavity comprising at least one wall permeable to at least one noble gas;
    injecting the at least one noble gas into the cavity through the at least one wall permeable to the at least one noble gas;
    hermetically sealing the cavity against air and the at least one noble gas injected into the cavity; and
    forming, between the encapsulating and the injecting, at least one portion of material impermeable to the at least one noble gas such that said at least one portion of material impermeable to the at least one noble gas partially covers the at least one wall permeable to the at least one noble gas.

2. The method according to claim 1, wherein the at least one noble gas comprises at least one of the following elements: helium neon and argon.

3. The method according to claim 1, in which encapsulation of the microelectronic device in the cavity includes the following steps:
    forming the at least one microelectronic device on at least one first substrate,
    bonding at least one second substrate to the at least one first substrate, thereby forming the cavity hermetically sealed against air, the at least one wall permeable to the at least one noble gas being formed by part of the second substrate.

4. The method according to claim 3, wherein the cavity is hermetically sealed against air and the at least one noble gas by at least one deposition of at least one layer of a material impermeable to air and the at least one noble gas, the at least one layer covering at least the part of the at least one second substrate forming the at least one wall permeable to the at least one noble gas.

5. The method according to claim 4, wherein the at least one layer of material impermeable to air and to the at least one noble gas comprises at least one of a semiconductor and a metal.

6. The method according to claim 3, also including forming at least one portion of material impermeable to the at least one noble gas such that said at least one portion of material impermeable to the at least one noble gas partially covers the part of the at least one second substrate thereby forming the at least one wall permeable to the at least one noble gas, between the encapsulation of the at least one microelectronic device in the cavity and the injection of the at least one noble gas into the cavity.

7. The method according to claim 1, wherein the encapsulating of the at least one microelectronic device in the cavity includes:
    forming at least one portion of sacrificial material covering the at least one microelectronic device;
    depositing at least one cap layer covering the at least one portion of sacrificial material and comprising at least one material impermeable to air;
    forming at least one opening through the at least one cap layer, thereby providing at least one access to the at least one portion of sacrificial material;

etching the at least one portion of sacrificial material through the at least one opening formed through the at least one cap layer; and closing the at least one opening with at least one material impermeable to air, wherein at least part of the at least one cap layer and the at least one material impermeable to air closing the at least one opening is permeable to the at least one noble gas and forms the at least one wall permeable to the at least one noble gas, or at least part of the at least one cap layer or the at least one material impermeable to air closing the at least one opening is permeable to the at least one noble gas and forms the at least one wall permeable to the at least one noble gas.

8. The method according to claim 7, wherein the hermetically sealing of the cavity against air and the at least one noble gas comprises at least one deposition of at least one layer of a material impermeable to air and the at least one noble gas, to cover at least the material impermeable to air and the at least one wall permeable to the at least one noble gas.

9. The method according to claim 7, further including forming at least one portion of another material that is impermeable to the at least one noble gas to cover the at least one material impermeable to air and permeable to the at least one noble gas, thereby forming the at least one wall permeable to the at least one noble gas, between the encapsulation of the at least one microelectronic device in the cavity and the injection of the at least one noble gas into the cavity.

10. The method according to claim 8, wherein the at least one layer of material impermeable to air and to the at least one noble gas comprises at least one of a semiconductor and a metal.

11. The method according to claim 1, wherein, when the at least one microelectronic device is encapsulated in the cavity, at least one portion of getter material is placed in the cavity, the method further comprising thermally activating the at least one portion of getter material during or after hermetic the hermetically sealing the cavity against air and the at least one noble gas, or thermally activating the at least one portion of getter material during and after the hermetically sealing the cavity against air and the at least one noble gas.

12. The method according to claim 1, wherein the encapsulating comprises a collective encapsulating of a plurality of microelectronic devices in several cavities hermetically sealed against air, each of the several cavities comprising at least one wall permeable to the at least one noble gas, wherein the injecting is performed for at least some of the several cavities, and wherein the hermetically sealing is applied collectively for all the several cavities.

13. The method according to claim 1, wherein the at least one wall permeable to the at least one noble gas comprises at least one of the following elements: semiconducting oxide, semiconducting nitride, and glass.

14. The method according to claim 1, wherein the at least one wall permeable to the at least one noble gas corresponds to an upper wall of the cavity.

* * * * *